United States Patent
Xue et al.

(10) Patent No.: US 12,542,538 B1
(45) Date of Patent: Feb. 3, 2026

(54) LOW-NOISE SHORT-OFFSET TRANSIENT ELECTROMAGNETIC RECEIVING CONDITIONING CIRCUIT AND RECEIVER

(71) Applicant: Institute of Geology and Geophysics, Chinese Academy of Sciences, Beijing (CN)

(72) Inventors: Guoqiang Xue, Beijing (CN); Xin Wu, Beijing (CN); Xuhong Wang, Beijing (CN); Weiying Chen, Beijing (CN); Pengfei Lv, Beijing (CN)

(73) Assignee: Institute of Geology and Geophysics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 19/030,348

(22) Filed: Jan. 17, 2025

(30) Foreign Application Priority Data

Jan. 10, 2025 (CN) .......................... 202510043522.8

(51) Int. Cl.
*H03H 11/04* (2006.01)
*H03F 3/04* (2006.01)
(Continued)

(52) U.S. Cl.
CPC .............. *H03H 11/04* (2013.01); *H03F 3/04* (2013.01); *H03H 17/02* (2013.01); *H03F 2200/294* (2013.01); *H03H 2017/0081* (2013.01)

(58) Field of Classification Search
CPC ................... H03H 11/04; H03H 17/02; H03H 2017/0081; H03H 11/0405;
(Continued)

(56) References Cited

U.S. PATENT DOCUMENTS

2017/0154715 A1\* 6/2017 Li ........................... H03M 1/12

FOREIGN PATENT DOCUMENTS

CN 102769435 A 11/2012
CN 104506144 A 4/2015
(Continued)

OTHER PUBLICATIONS

First Office Action issued in counterpart Chinese Patent Application No. 202510043522.8, dated Mar. 13, 2025.
(Continued)

*Primary Examiner* — Jung Kim
(74) *Attorney, Agent, or Firm* — Westbridge IP LLC

(57) ABSTRACT

Disclosed are a low-noise, short-offset transient electromagnetic receiving conditioning circuit and a receiver. The conditioning circuit includes: a first power supply filtering circuit, a second power supply filtering circuit, an active filtering circuit, a power frequency noise suppression circuit, and a low-noise amplification circuit. The first and second power supply filtering circuits are used to filter the first and second power supplies, respectively, to reduce noise. The active filtering circuit is designed to filter out interference signals. The power frequency noise suppression circuit is used to eliminate power frequency noise. The low-noise amplification circuit includes an input-stage amplification circuit, an intermediate-stage amplification circuit, and an output-stage amplification circuit. The technical solution of this disclosure incorporates multiple filtering circuits to remove noise, thereby facilitating noise reduction.

9 Claims, 7 Drawing Sheets

(51) Int. Cl.
*H03H 17/02* (2006.01)
*H03H 17/00* (2006.01)

(58) Field of Classification Search
CPC ........... H03H 17/0202; H03H 17/0248; H03H 7/0107; H03H 7/0146; H03H 7/0138; H03H 7/0153; H03H 11/00; H03F 3/04; H03F 2200/294
See application file for complete search history.

(56) References Cited

FOREIGN PATENT DOCUMENTS

| | | | |
|---|---|---|---|
| CN | 116260408 A | 6/2023 | |
| CN | 117331127 A | 1/2024 | |
| CN | 118034997 A | 5/2024 | |
| CN | 118169767 A | 6/2024 | |

OTHER PUBLICATIONS

Second Office Action issued in counterpart Chinese Patent Application No. 202510043522.8, dated Apr. 17, 2025.
Wang et al., Design and Application of Semi-aircraft Electromagnetic Receiving System, Instrument Technique and Sensor, 2024, vol. 2, pp. 50-55, dated Feb. 29, 2024.
Wu et al., The Development and Applications of the Semi-Airborne Electromagnetic System in China, IEEE Access, 2019, vol. 7, pp. 104956-104966, dated Aug. 14, 2019.
Xue et al., Research Progress on Electrical Source Short Offset Transient Electromagnetic Method, Journal of China University of Mining & Technology, vol. 49, No. 2, pp. 215-226, dated Mar. 31, 2020.

\* cited by examiner

LOW-NOISE SHORT-OFFSET TRANSIENT ELECTROMAGNETIC RECEIVING CONDITIONING CIRCUIT AND RECEIVER

CROSS-REFERENCE TO RELATED APPLICATIONS

This application claims priority to Chinese Patent Application No. 202510043522.8, filed on Jan. 10, 2025, the content of which is incorporated herein by reference in its entirety.

TECHNICAL FIELD

The present disclosure relates to the field of electronic technology, and more specifically, to a low-noise, short-offset transient electromagnetic receiving conditioning circuit and receiver.

BACKGROUND

The Short-Offset Transient Electromagnetic (SOTEM) method offers the advantages of deep detection and high resolution.

As a broadband near-source method, SOTEM requires overcoming bandwidth limitations to fully exploit its detection potential by achieving a large bandwidth on the receiving end.

However, under large bandwidth conditions, noise interference becomes a significant challenge.

SUMMARY

To address the issues in related technologies, the present disclosure provides a low-noise, short-offset transient electromagnetic receiving conditioning circuit and receiver to solve the problem of severe noise interference under large bandwidth conditions.

In accordance with the first aspect of the present disclosure, a low-noise, short-offset transient electromagnetic receiving conditioning circuit is provided, comprising:
  a first power supply filtering circuit;
  a second power supply filtering circuit;
  an active filtering circuit;
  a power frequency noise suppression circuit; and
  a low-noise amplification circuit.

The first power supply filtering circuit and the second power supply filtering circuit are configured to filter the first power supply and the second power supply, respectively, to reduce noise.

The active filtering circuit is configured to filter out interference signals.

The power frequency noise suppression circuit is configured to filter out power frequency noise.

The low-noise amplification circuit includes:
  an input-stage amplification circuit;
  an intermediate-stage amplification circuit; and
  an output-stage amplification circuit.

In one embodiment, the input-stage amplification circuit comprises:
  a first transistor, a second transistor, a third transistor, a fourth transistor, a fifth transistor, a sixth transistor, a seventh transistor, an eighth transistor, and a ninth transistor;
  a first resistor, a second resistor, a third resistor, a fourth resistor, a fifth resistor, and a sixth resistor.

The first transistor and the second transistor form a current mirror.

The emitters of the first transistor and the second transistor are connected to the power supply, respectively.

The base of the first transistor is connected to the base of the second transistor, as well as to the collectors of the third transistor and the fourth transistor.

The collector of the first transistor is connected to the collector of the fourth transistor.

The base of the third transistor is connected to the first terminal of the first resistor, and the second terminal of the first resistor is grounded.

The base of the fourth transistor is connected to the first terminal of the second resistor, and the second terminal of the second resistor is grounded.

The emitter of the third transistor is connected to the emitter of the fifth transistor.

The emitter of the fourth transistor is connected to the emitter of the sixth transistor.

The base of the fifth transistor is connected to the base of the sixth transistor.

The collector of the fifth transistor is connected to the collector of the seventh transistor and the base of the ninth transistor.

The collector of the sixth transistor is connected to the collector of the eighth transistor and the base of the twelfth transistor in the intermediate-stage amplification circuit.

The base of the seventh transistor is connected to the base of the eighth transistor.

The emitter of the seventh transistor is connected to the first terminals of the fourth resistor and the third resistor, respectively.

The emitter of the eighth transistor is connected to the first terminals of the fifth resistor and the second terminal of the third resistor.

The second terminals of the fourth resistor and the fifth resistor are connected to a negative voltage.

In one embodiment, the intermediate-stage amplification circuit comprises:
  a seventh resistor, an eighth resistor, a ninth resistor, a tenth resistor, a zeroth resistor, a thirteenth transistor, an eleventh transistor, and a twelfth transistor.

The first terminals of the seventh resistor and the eighth resistor are connected to a positive voltage, respectively.

The second terminal of the seventh resistor is connected to the bases of the thirteenth transistor and the eleventh transistor, and the collector of the eleventh transistor.

The emitters of the thirteenth transistor and the eleventh transistor are connected to a negative voltage.

The second terminal of the eighth resistor is connected to the first terminal of the ninth resistor.

The second terminal of the ninth resistor is connected to the second terminal of the zeroth resistor and the collector of the twelfth transistor.

The emitter of the twelfth transistor is connected to the first terminal of the tenth resistor, and the second terminal of the tenth resistor is connected to a negative voltage.

In one embodiment, the output-stage amplification circuit comprises:
  a thirteenth resistor, an eleventh resistor, a twelfth resistor, a fourteenth resistor, a first capacitor, a second capacitor, and a third capacitor.

The first terminal of the thirteenth resistor is connected to a positive voltage.

The second terminal of the thirteenth resistor is connected to the first terminal of the second capacitor and the first terminal of the operational amplifier.

The second terminal of the second capacitor is connected to ground and the first terminal of the eleventh resistor.

The second terminal of the eleventh resistor is connected to the positive input of the operational amplifier and the first terminal of the first capacitor.

The second terminal of the first capacitor is connected to the first terminal of the zeroth resistor and the second terminal of the ninth resistor in the intermediate-stage amplification circuit.

The first terminal of the twelfth resistor is connected to the negative input of the operational amplifier.

The second terminal of the twelfth resistor is connected to ground and the first terminal of the third capacitor.

The second terminal of the third capacitor is connected to the second terminal of the operational amplifier and the first terminal of the fourteenth resistor.

The second terminal of the fourteenth resistor is connected to a negative voltage.

In one embodiment, the first power supply filtering circuit comprises:
  a thirteenth transistor, the emitter of which is connected to the anodes of an eighth diode and a ninth diode, as well as the first terminal of a first filter capacitor.

The second terminal of the first filter capacitor is grounded.

The collector of the thirteenth transistor is connected to the cathode of a seventh diode, the first terminal of a second filter capacitor, and the first terminal of a seventeenth resistor.

Additional components are connected as described.

BRIEF DESCRIPTION OF THE DRAWINGS

The figures appended hereto are incorporated into the specification and form a part thereof, illustrating embodiments in accordance with the present disclosure and, together with the specification, are used to explain the principles of the present disclosure. In the drawings.

DETAILED DESCRIPTION OF THE EMBODIMENTS

Figure 1:
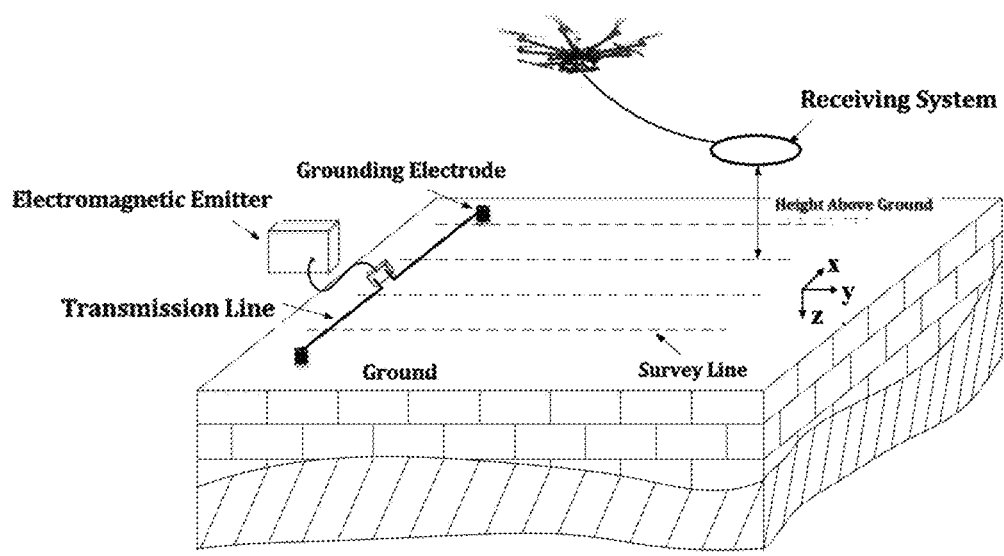
FIG. 1 is a schematic diagram of a semi-airborne frequency-domain electromagnetic method according to an exemplary embodiment.

The exemplary embodiments are described in detail herein and illustrated in the drawings. Unless otherwise indicated, identical or similar elements are denoted by the same reference numerals in different drawings. The embodiments described in the following exemplary embodiments do not represent all implementations consistent with this disclosure. Instead, they are merely examples of devices and methods consistent with certain aspects of the disclosure as detailed in the appended claims.

It should be noted that all actions for acquiring signals, information, or data in this application are conducted in compliance with the corresponding data protection regulations of the country where the actions are performed and are authorized by the respective device owners.

Principle of the Semi-Airborne Frequency-Domain Electromagnetic Method

Referring to FIG. 1, the semi-airborne frequency-domain electromagnetic method is an active source exploration method using ground-based transmission and airborne reception to explore geological structures. The semi-airborne electromagnetic exploration involves cooperation between the transmission system and the receiving system.

The exploration principle is as follows.

The electromagnetic transmitter is located on the ground, providing alternating current to a grounded wire as the excitation source.

The alternating current generates a changing magnetic field, called the primary field.

Under the influence of the primary field, eddy currents are induced in the underground medium, which gradually decay over time.

The changing eddy currents produce an induced magnetic field, referred to as the secondary field.

A semi-airborne electromagnetic receiving system mounted on a drone receives the secondary field data in the air through magnetic field sensors. The magnetic induction coil converts the varying magnetic field signals into induced voltage signals. The receiving system conditions the induced voltage signals (e.g., amplifies, filters) using electronic units before acquiring and storing the data.

Based on the electromagnetic property differences between underground anomalies (e.g., mineral resources) and the earth, the data stored in the semi-airborne electromagnetic receiving system is processed (e.g., inversion, forward modeling), combined with transmission waveforms and geological exploration experience, to interpret and analyze the underground structure and anomaly locations. This process enables the exploration of deep geological structures.

The receiving system primarily consists of two components:
  a magnetic induction coil, which serves as the sensor to receive the secondary field signals; and
  a receiver that performs noise reduction, amplification, and data acquisition on the signals from the sensor.

Under large bandwidth conditions, noise interference in the receiver is severe.

Low-Noise Short-Offset Transient Electromagnetic Receiving Conditioning Circuit

Figure 2:
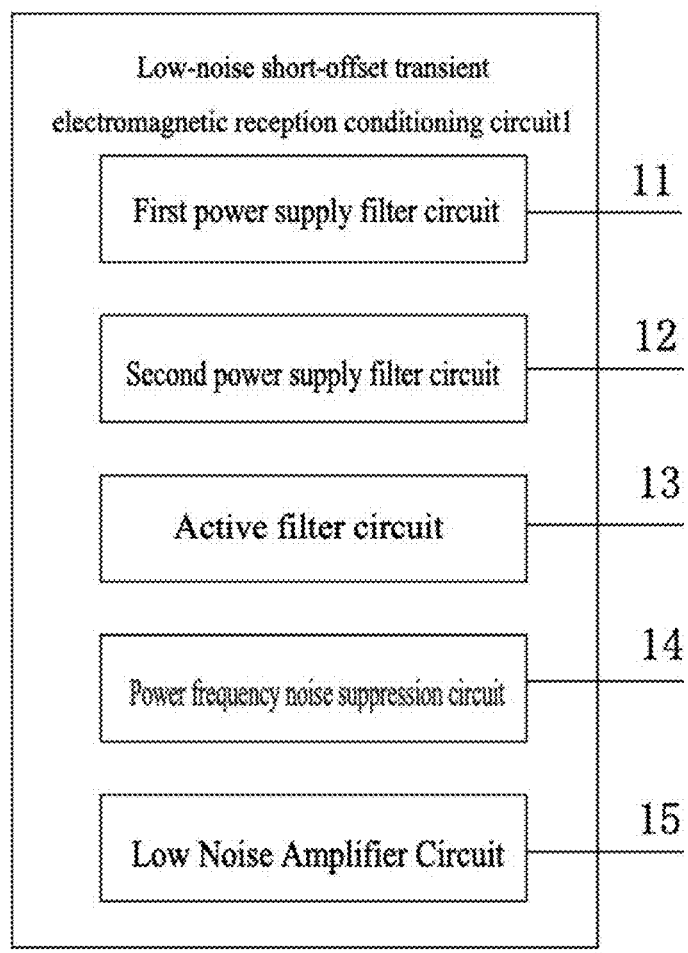
FIG. 2 is a block diagram of a low-noise short-offset transient electromagnetic signal conditioning circuit according to an exemplary embodiment.

Based on the above, the present application proposes a low-noise short-offset transient electromagnetic receiving conditioning circuit (as shown in FIG. 2), which comprises:
  a first power supply filtering circuit 11;
  a second power supply filtering circuit 12;
  an active filtering circuit 13;
  a power frequency noise suppression circuit 14; and
  a low-noise amplification circuit 15.

The first power supply filtering circuit 11 and the second power supply filtering circuit 12 are configured to filter the first and second power supplies, respectively, to reduce noise.

The active filtering circuit 13 is configured to filter out interference signals.

The power frequency noise suppression circuit 14 is configured to filter out power frequency noise.

The low-noise amplification circuit 15 comprises:
an input-stage amplification circuit,
an intermediate-stage amplification circuit, and
an output-stage amplification circuit.

The above technical solution, including the first power supply filtering circuit, the second power supply filtering circuit, the active filtering circuit, the power frequency noise suppression circuit, and the low-noise amplification circuit, effectively eliminates noise.

Design of Multi-Stage Amplification Circuit

In some embodiments, to meet the project requirements for high and adjustable gain, the low-noise amplification circuit is composed of three stages:
an input-stage amplification circuit,
an intermediate-stage amplification circuit, and
an output-stage amplification circuit.

The noise in the multi-stage amplification circuit is primarily determined by the input-stage amplification circuit. To minimize noise, the input-stage amplification circuit is constructed with discrete components, as their internal noise is significantly lower than that of integrated operational amplifiers.

To further enhance performance, low-noise bipolar junction transistors (BJTs) are used as the core components for the input and intermediate stages. To reduce common-mode interference caused by DC coupling, the amplification circuit adopts a differential input configuration.

Dual-channel PNP matched transistors (MAT03) and dual-channel NPN matched transistors (MAT12) are used in the design. These matched transistors contain two highly similar transistors with negligible parameter differences. Their high matching accuracy reduces the impact of transistor differences on the circuit, ensuring optimal performance of the differential circuit.

Figure 3:
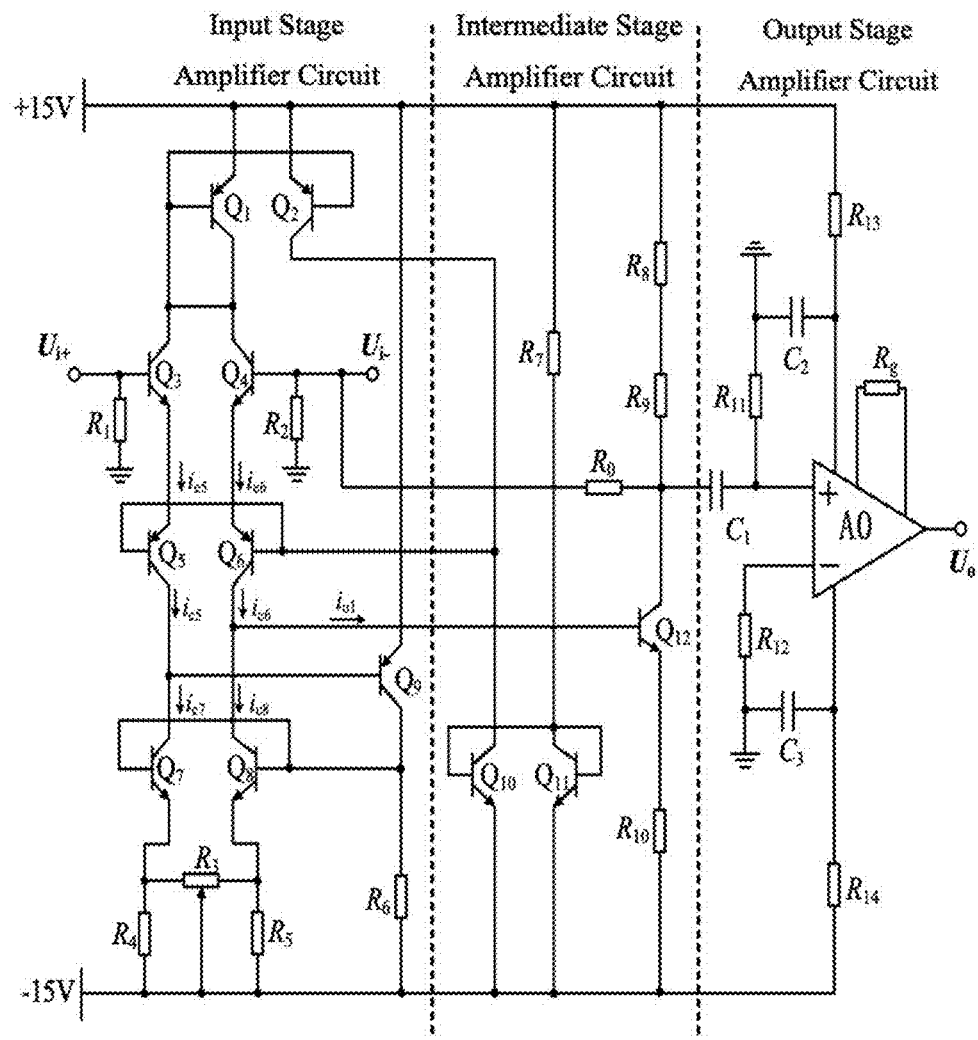
FIG. 3 is a circuit diagram of a low-noise amplification circuit according to an exemplary embodiment.

Referring to FIG. 3, the aforementioned input-stage amplification circuit includes the first transistor Q1, the second transistor Q2, the third transistor Q3, the fourth transistor Q4, the fifth transistor Q5, the sixth transistor Q6, the seventh transistor Q7, the eighth transistor Q8, the ninth transistor Q9, the first resistor R1, the second resistor R2, the third resistor R3, the fourth resistor R4, the fifth resistor R5, and the sixth resistor R6. The first transistor Q1 and the second transistor Q2 form a current mirror. The emitters of Q1 and Q2 are connected to the power supply. The base of Q1 is connected to the base of Q2, the collector of Q3, and the collector of Q4. The collector of Q1 is connected to the collector of Q4. The base of Q3 is connected to the first terminal of R1, and the second terminal of R1 is grounded. The base of Q4 is connected to the first terminal of R2, and the second terminal of R2 is grounded. The emitter of Q3 is connected to the emitter of Q5. The emitter of Q4 is connected to the emitter of Q6. The base of Q5 is connected to the base of Q6. The collector of Q5 is connected to the collector of Q7 and the base of Q9. The collector of Q6 is connected to the collector of Q8 and the base of the twelfth transistor in the intermediate-stage amplification circuit. The base of Q7 is connected to the base of Q8. The emitter of Q7 is connected to the first terminal of R4 and the first terminal of R3. The emitter of Q8 is connected to the first terminal of R5 and the second terminal of R3. The second terminals of R4 and R5 are connected to the negative voltage. When the operating current of MAT03 and MAT12 is maintained above 0.01 mA, their noise can remain stable. To ensure the normal and stable operation of the transistors, a reasonable bias circuit design is required. Voltage-source bias circuits are easily affected by temperature and power supply fluctuations, causing output voltage drift and reducing the stability of the bias circuit. Moreover, the input terminal of the amplification circuit designed in this invention is directly coupled, and a voltage source introduces a DC voltage component into the signal, limiting the range of signal variation. Additionally, the voltage source has limited control over the collector current of transistors, making it less effective in suppressing circuit noise. Therefore, this invention adopts a current-source design for the bias circuit. Transistors Q1, Q2, Q10, and Q11 form a current mirror. The high matching accuracy of MAT12 and MAT03 transistors effectively resolves the stringent matching requirements of current mirror circuits.

The input-stage amplification circuit is constructed with MAT12 (Q3, Q4, Q7, Q8) and MAT03 (Q5, Q6) as its core components. The input signal is applied to the bases of the third transistor Q3 and the fourth transistor Q4. The common-collector amplifier circuit formed by the third transistor Q3 and the fourth transistor Q4 has high input impedance and low output impedance, enhancing the load-driving capability of the entire circuit. The fifth transistor Q5 and the sixth transistor Q6 form a common-base amplifier, which provides high voltage gain while improving the circuit bandwidth. The seventh transistor Q7, the eighth transistor Q8, and the ninth transistor Q9 serve as active loads, transferring changes in the collector current $\Delta ic5$ of the fifth transistor Q5 to the collector of the sixth transistor Q6. The signal is output from the collector of the sixth transistor Q6, thereby achieving differential input and single-ended output. Since the parameters of the transistors are approximately identical, when a differential signal is input, $\Delta ie5=-\Delta ie6$, and $\Delta ib5=\Delta ib6$, thus $\Delta ic5=-\Delta ic6$. The base current of the transistor Q9 is negligible, so $\Delta ic5=\Delta ic7$. When R4=R5, then $\Delta ic7=\Delta ic8$, and therefore $\Delta iol=\Delta ic6-\Delta ic8=-2\Delta ic5$. When a common-mode signal is input, $\Delta ic5=\Delta ic6$, and similarly, $\Delta iol=0$. This demonstrates that the input-stage amplification circuit can amplify differential signals while suppressing external noise and common-mode signal interference. Adjusting resistor R3 can eliminate the effects of temperature drift and transistor variations.

In some embodiments, the aforementioned intermediate-stage amplification circuit includes the seventh resistor R7, the eighth resistor R8, the ninth resistor R9, the tenth resistor R10, the zero resistor R0, the tenth transistor Q10, the eleventh transistor Q11, and the twelfth transistor Q12. The first terminals of the seventh resistor R7 and the eighth resistor R8 are connected to the positive voltage. The second terminal of the seventh resistor R7 is connected to the bases of the tenth transistor Q10 and the eleventh transistor Q11, and the collector of the eleventh transistor Q11. The emitters of the tenth transistor Q10 and the eleventh transistor Q11 are connected to the negative voltage. The second terminal of the eighth resistor R8 is connected to the first terminal of the ninth resistor R9. The second terminal of the ninth resistor R9 is connected to the second terminal of the zero resistor R0 and the collector of the twelfth transistor Q12. The emitter of the twelfth transistor Q12 is connected to the first terminal of the tenth resistor R10, and the second terminal of the tenth resistor R10 is connected to the negative voltage.

The intermediate-stage amplification circuit is constructed with the twelfth transistor Q12 as the core, forming a common-emitter amplifier circuit. The twelfth transistor Q12 is an NPN-type transistor, model 2N2222. It amplifies voltage while introducing the negative feedback resistor R0, which is connected between the input terminal Ui and the collector of Q12 to control the amplification factor of the circuit. The eighth resistor R8, a high-value resistor, and the ninth resistor R9, a low-value resistor, are used for coarse and fine adjustments of the offset voltage, respectively, ensuring that the DC component of the twelfth transistor Q12 is close to zero.

In some embodiments, the aforementioned output-stage amplification circuit includes the thirteenth resistor R13, the eleventh resistor R11, the twelfth resistor R12, the fourteenth resistor R14, the first capacitor C1, the second capacitor C2, and the third capacitor C3. The first terminal of the thirteenth resistor R13 is connected to the positive voltage, which is 15 V. The second terminal of the thirteenth resistor R13 is connected to the first terminal of the second capacitor C2 and the first terminal of the operational amplifier. The second terminal of the second capacitor C2 is grounded and connected to the first terminal of the eleventh resistor R11. The second terminal of the eleventh resistor R11 is connected to the positive input terminal of the operational amplifier A0 and the first terminal of the first capacitor C1. The second terminal of the first capacitor C1 is connected to the first terminal of the zero resistor R0 in the intermediate-stage amplification circuit and the second terminal of the ninth resistor R9. The first terminal of the twelfth resistor R12 is connected to the negative input terminal of the operational amplifier A0, and its second terminal is grounded and connected to the first terminal of the third capacitor C3. The second terminal of the third capacitor C3 is connected to the second terminal of the operational amplifier A0 and the first terminal of the fourteenth resistor R14. The second terminal of the fourteenth resistor R14 is connected to the negative voltage, which is −15 V.

The output-stage amplification circuit is built around the operational amplifier A0. The integrated operational amplifier chip features excellent low-noise amplification performance and a high common-mode rejection ratio, making it particularly suitable for conditioning weak signals. The first capacitor C1 is a decoupling capacitor used to eliminate DC bias. The second capacitor C2 and the third capacitor C3 are filter capacitors that reduce the impact of power supply ripple. The thirteenth resistor R13 and the fourteenth resistor R14 are current-limiting resistors that prevent excessive current from damaging the operational amplifier A0. The operational amplifier A0 requires a return path to ground for its input bias current, which is provided by the eleventh resistor R11 and the twelfth resistor R12. Rg is an adjustable resistor, and changing its resistance value allows for adjustable gain in the output-stage amplification circuit.

The stability of the power supply system is equally important, as excessive power supply noise can severely affect the system's performance. This invention employs a dual-power supply system, and to reduce voltage ripple, an electronic filtering circuit is designed.

Figure 4:
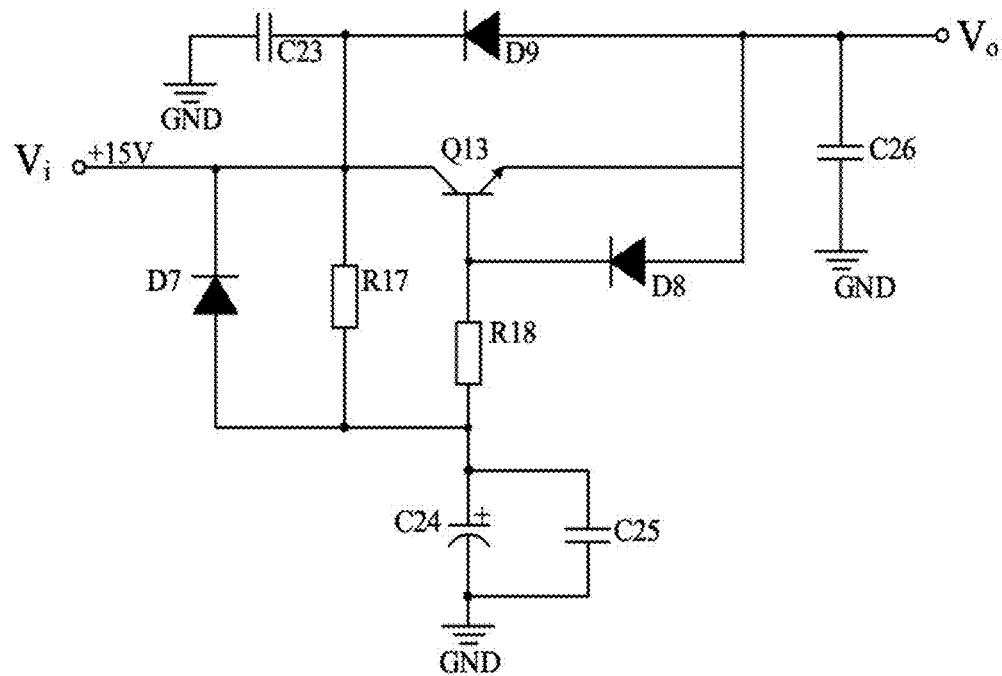
FIG. 4 is a circuit diagram of a first power supply filter circuit according to an exemplary embodiment.

Referring to FIG. 4, the aforementioned first power supply filtering circuit 11 includes the thirteenth transistor Q13. The emitter of the thirteenth transistor Q13 is connected to the anode of the eighth diode D8, the anode of the ninth diode D9, and the first terminal of the first filter capacitor C26. The second terminal of the first filter capacitor C26 is grounded. The collector of the thirteenth transistor Q13 is connected to the cathode of the seventh diode D7, the first terminal of the second filter capacitor C23, the first terminal of the seventeenth resistor R17, the cathode of the seventh diode D7, and the input power supply. The second terminal of the seventeenth resistor R17, the anode of the seventh diode D7, the second terminal of the eighteenth resistor R18, the first terminal of the third filter capacitor C24, and the first terminal of the fourth filter capacitor C25 are connected together. The second terminals of the third filter capacitor C24 and the fourth filter capacitor C25 are also connected together and grounded. The base of the thirteenth transistor Q13 is connected to the cathode of the eighth diode D8 and the first terminal of the eighteenth resistor R18.

The first power supply provides +15 V. The first power supply filtering circuit consists of two parts: the first part is a x-type filter composed of the second filter capacitor C23, the seventeenth resistor R17, and the third filter capacitor C24, which filters out the ripple of Vi. The second part is an emitter follower composed of the thirteenth transistor Q13, the seventeenth resistor R17, and the eighteenth resistor R18. The seventeenth resistor R17 and the eighteenth resistor R18 serve as bias resistors for the thirteenth transistor Q13 to stabilize the base potential. Because the current fluctuation at the base of the thirteenth transistor Q13 is minimal, the output emitter current is also relatively stable. The emitter follower amplifies the current, enhancing the load-driving capability of the circuit.

The thirteenth transistor Q13, the seventeenth resistor R17, and the third filter capacitor C24 form a capacitor multiplier, which can be equivalent to a filter capacitor. Its equivalent capacitance is approximately equal to the third filter capacitor C24 multiplied by the current gain of the transistor, significantly increasing the capacitance value and improving the filtering effect. The advantage of the capacitor multiplier is that, with the same capacitance value, its size is smaller than that of a real capacitor. It can effectively suppress power supply ripple noise under load, especially suitable for designing the electronic units of short-offset transient electromagnetic receiving systems where low-noise DC power supply is required.

Figure 5:
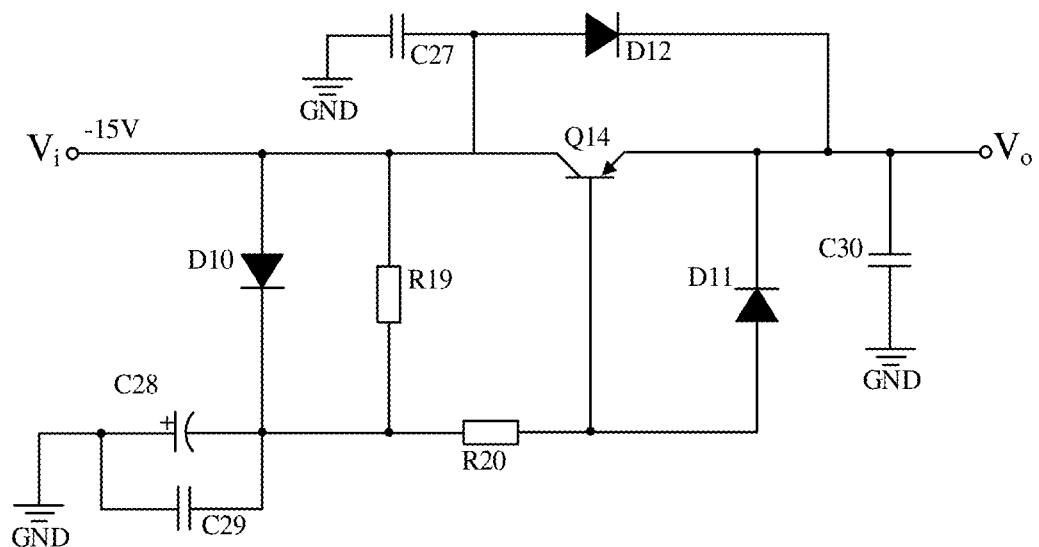
FIG. 5 is a circuit diagram of a second power supply filter circuit according to an exemplary embodiment.

Referring to FIG. 5, the aforementioned second power supply filtering circuit 12 includes the fourteenth transistor Q14. The emitter of the fourteenth transistor Q14 is connected to the cathode of the eleventh diode D11, the first terminal of the fifth filter capacitor C30, and the cathode of the twelfth diode D12. The second terminal of the fifth filter capacitor C30 is grounded. The base of the fourteenth transistor Q14 is connected to the first terminal of the twentieth resistor R20 and the anode of the eleventh diode D11. The collector of the fourteenth transistor Q14 is connected to the first terminal of the nineteenth resistor R19, the anode of the twelfth diode D10, the anode of the twelfth diode D12, and the first terminal of the sixth filter capacitor C27. The second terminal of the sixth filter capacitor C27 is grounded. The cathode of the twelfth diode D10 is connected to the second terminal of the twentieth resistor R20. The second terminal of the nineteenth resistor R19, the first terminal of the seventh filter capacitor C28, and the first terminal of the eighth filter capacitor C29 are connected together. The second terminals of the seventh filter capacitor C28 and the eighth filter capacitor C29 are connected together and grounded.

Figure 6:
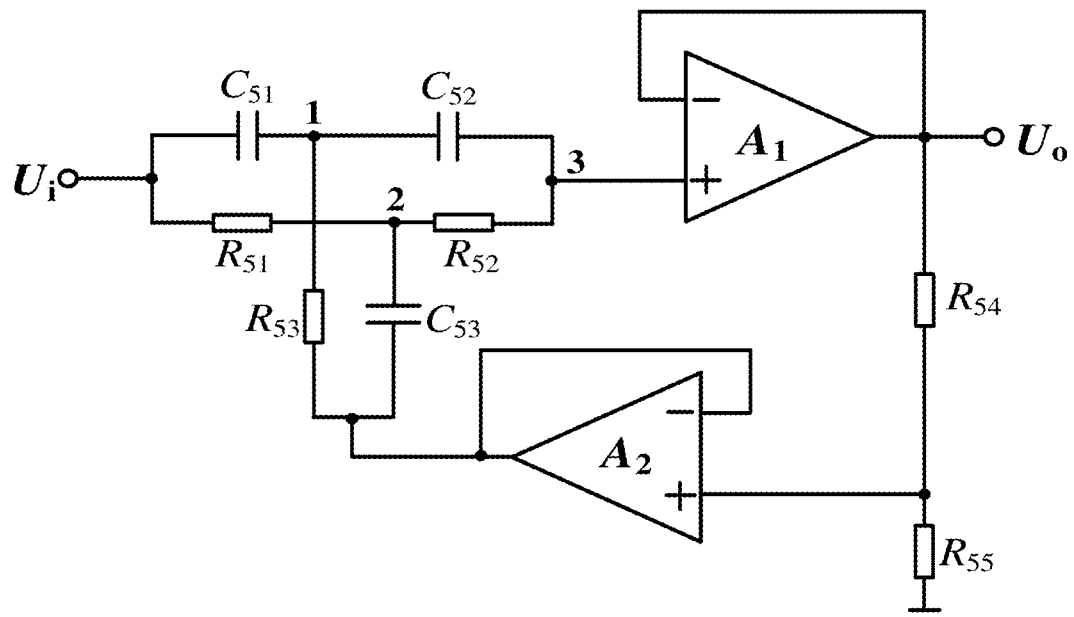
FIG. 6 is a circuit diagram of a power frequency noise suppression circuit according to an exemplary embodiment.
Figure 7:
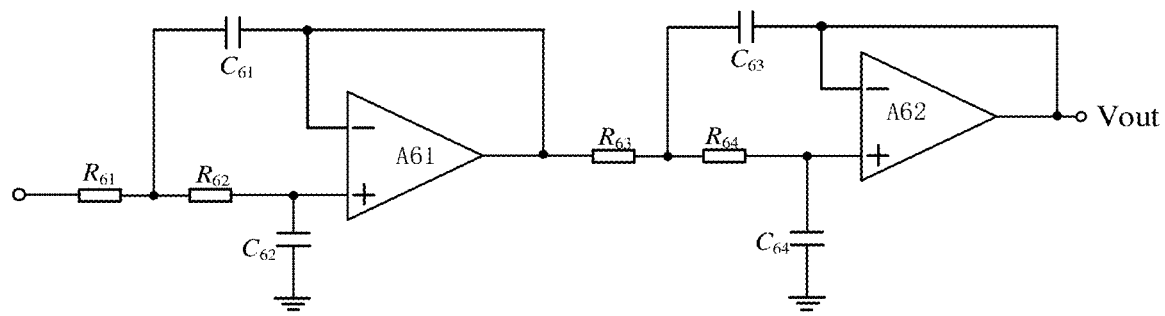
FIG. 7 is a circuit diagram of an active filter circuit according to an exemplary embodiment.
Figure 8:
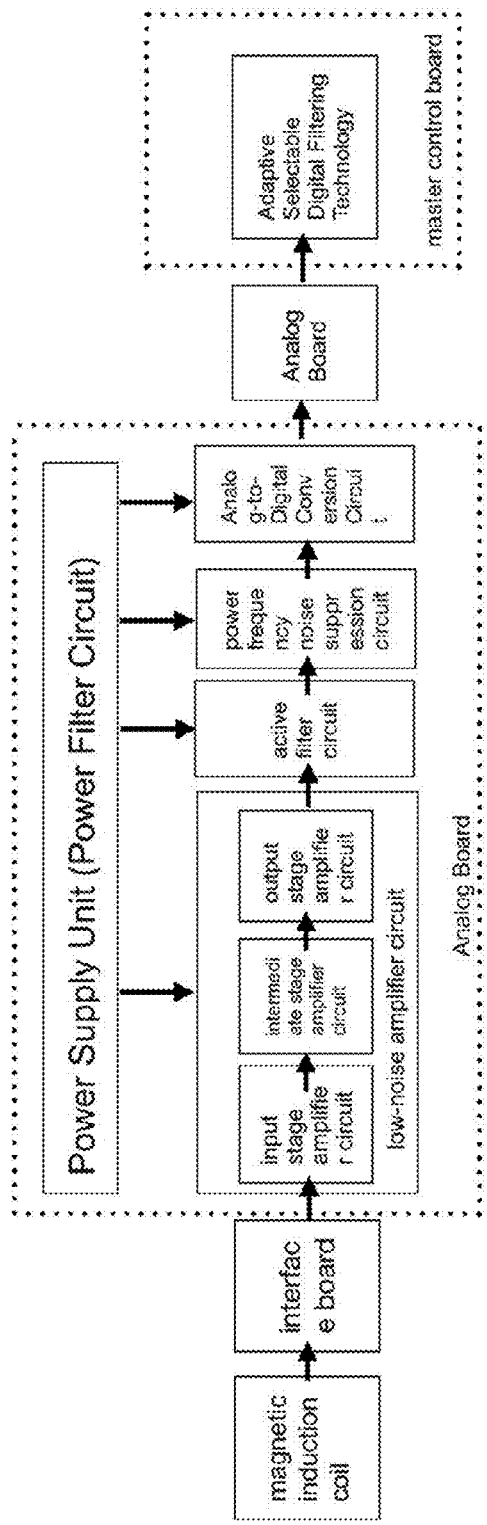
FIG. 8 is a structural block diagram of a receiver according to an exemplary embodiment.
Figure 9:
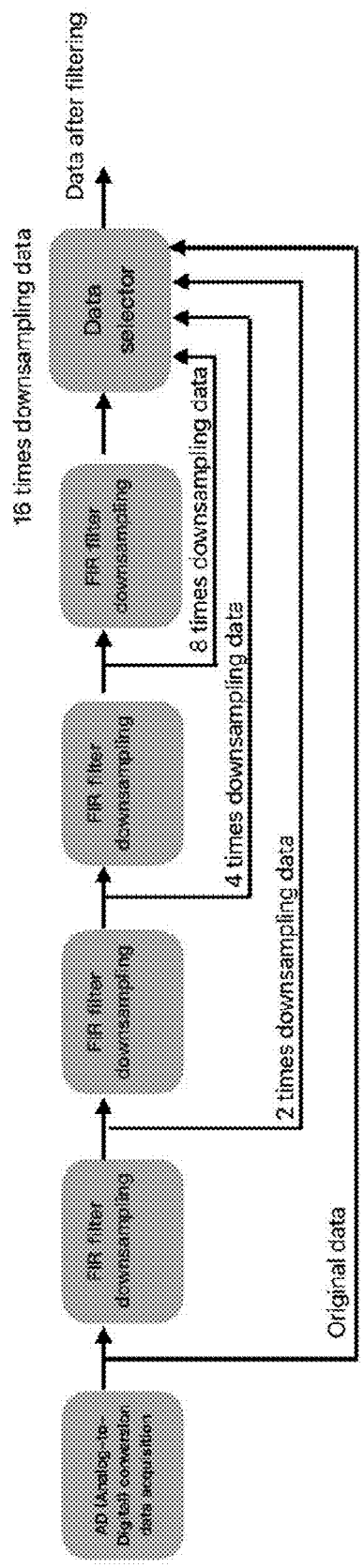
FIG. 9 is a combination of cascaded digital filters according to an exemplary embodiment.

Referring to FIG. 6, during practical exploration using the short-offset transient electromagnetic method, the magnetic induction coil also picks up noise within the target frequency band, which is superimposed onto the signal. Since power grid equipment operates at 50 Hz AC, the target signal often contains 50 Hz power frequency noise, which significantly interferes with subsequent signal processing. Therefore, it is necessary to filter out this specific 50 Hz frequency. This invention uses a twin-T notch filter to eliminate power frequency interference signals and introduces voltage-controlled feedback, providing excellent frequency selection characteristics and filtering performance. The filter primarily comprises three modules: a frequency selection module, an amplification module, and a feedback module.

The power frequency noise suppression circuit 14 includes an amplifier and a voltage follower. The positive input terminal of the amplifier A1 is connected to the first terminal of the second filter capacitor C52 and the first terminal of the second filter resistor R52. The output terminal of the amplifier A1 outputs the voltage UO. The second terminal of the second filter capacitor C52 is connected to the first terminal of the first filter capacitor C51 and the first terminal of the third filter resistor R53. The second terminal of the second filter resistor R52 is connected to the first terminal of the third filter capacitor C53 and the first terminal of the first filter resistor R51, where the first terminal of the first filter resistor R51 serves as the input power supply Ui. The second terminals of the first filter capacitor C51 and the first filter resistor R51 are connected together. The second terminals of the third filter resistor R53 and the third filter capacitor C53 are connected together and further connected to the output terminal of the voltage follower. The positive input terminal of the voltage follower A2 is connected to the first terminal of the fifth filter resistor R55 and the first terminal of the fourth filter resistor R54. The second terminal of the fifth filter resistor R55 is grounded, while the second terminal of the fourth filter resistor R54 is connected to the output terminal of the amplifier A1. A single-T network composed of R51, R52, and C53 can be regarded as a low-pass filter. Another single-T network composed of C51, C52, and R53 can be regarded as a high-pass filter. By adjusting the resistance and capacitance values, the center frequency of the notch filter, i.e., the frequency to be eliminated, can be determined. The output terminal of the amplifier A1 serves as the output of the notch filter. Additionally, the output terminal of the amplifier A1 and the voltage follower A2 form a voltage feedback circuit, where part of the output signal from the amplifier A1 is fed back to the vertical arm of the twin-T network to create bootstrapping, thus introducing positive feedback. The fourth filter resistor R54 and the fifth filter resistor R55 determine the value of the positive feedback coefficient m.

The center frequency of the notch filter in this invention is 50 Hz. When the input signal is at other frequencies, its gain is 1. The operational amplifier chip AD8602 is selected for its small temperature sensitivity, large dynamic range, and ability to stably respond to input signals under low-voltage power supply.

The bandwidth BW and quality factor ( ) of a wave limiter are defined as follows:

$$BW = f_H - f_L = 4(1-m)f_0;$$

$$Q = \frac{f_0}{f_H - f_L} = \frac{1}{4(1-m)};$$

where BW is the bandwidth, $f_H$ is the upper cutoff frequency, $f_L$ is the lower cutoff frequency, $f_0$ is the center frequency, and Q is the ratio of the center frequency to the bandwidth. The parameter m represents the positive feedback coefficient.

To achieve desirable filtering performance in a wave limiter—i.e., narrow bandwidth and high Q—the value of m should be close to 1. The bandwidth BW of the wave limiter is inversely proportional to the quality factor Q at a fixed center frequency $f_0$. When the center frequency is set at 50 Hz, increasing the Q value will effectively reduce the bandwidth.

In some embodiments, when the electromagnetic receiving system operates, the magnetic induction coil receives signals of all frequencies from the environment. These signals include substantial noise, such as environmental noise, drone flight noise, noise generated by electronic components on circuit boards, and ripple noise introduced by batteries and power supplies. This noise increases the complexity of subsequent data processing and analysis and may even directly affect the exploration results. Additionally, when signals of various frequencies are superimposed in the time domain, the signal amplitude may exceed the maximum input voltage of the receiving system. The noise generated by electronic components is also positively correlated with the bandwidth. Therefore, an appropriate filter design is needed to restrict the bandwidth of the signal conditioning circuit in the receiving system and block interference signals outside the desired frequency range. The active low-pass filter circuit has a passband cutoff frequency set to 15 kHz and a stopband starting frequency set to 30 kHz, with a passband attenuation of 3 dB and a stopband attenuation of 30 dB. It is implemented using two second-order filters cascaded to form a fourth-order Butterworth low-pass filter.

What is claimed is:

1. A receiver, comprising: a low-noise short-offset transient electromagnetic receiving signal conditioning circuit, a main control board, a connection board, an interface board, and an analog board;
    wherein the low-noise short-offset transient electromagnetic receiving signal conditioning circuit is disposed on the analog board;
    the connection board comprises a magnetic coupling isolation module, the magnetic coupling isolation module is connected to digital signal ports of the analog board and the main control board, respectively;
    the main control board comprises a multi-processor system-on-chip (MPSoC) as a main control chip, the MPSoC comprises an ARM portion and an FPGA portion, the FPGA portion is configured to control the analog board to perform analog-to-digital conversion, receive and parse converted data, receive and parse GPS data, calibrate a temperature-compensated crystal oscillator, and manage system power functions;
    the ARM portion is configured to perform overall acquisition station process control, human-machine interaction, and data storage;
    the ARM portion communicates with the FPGA portion via an internal AXI bus of the MPSoC, and is configured to configure acquisition parameters and control acquisition start and stop by reading from and writing to FPGA registers;
    analog-to-digital conversion data parsed by the FPGA portion is transmitted in a data stream form to the ARM portion, and the ARM portion stores the data to an external hard disk;
    the analog board comprises an analog-to-digital conversion circuit; the analog-to-digital conversion circuit is connected via the connection board to the MPSoC on the main control board;
    the interface board integrates a magnetic field sensor interface; the magnetic field sensor interface is connected to an analog channel input end of the analog board; and the low-noise short-offset transient electromagnetic receiving signal conditioning circuit comprises:

a first power supply filtering circuit, a second power supply filtering circuit, an active filtering circuit, a power frequency noise suppression circuit, and a low-noise amplification circuit;

wherein the first power supply filtering circuit and the second power supply filtering circuit are configured to filter a first power supply and a second power supply, respectively, to reduce noise;

the active filtering circuit is configured to filter out interference signals;

the power frequency noise suppression circuit is configured to filter out power frequency noise; and the low-noise amplification circuit comprises: an input-stage amplification circuit, a middle-stage amplification circuit, and an output-stage amplification circuit.

2. The receiver according to claim 1, wherein
the power frequency noise suppression circuit comprises:
an amplifier and a voltage follower;
a non-inverting input end of the amplifier is connected to a first end of a second filtering capacitor and a first end of a second filtering resistor;
a second end of the second filtering capacitor is connected to a first end of a first filtering capacitor and a first end of a first filtering resistor;
a second end of the second filtering resistor is connected to a first end of a third filtering capacitor and a first end of a third filtering resistor;
a second end of the first filtering capacitor and a second end of the first filtering resistor are connected together;
a second end of the third filtering resistor and a second end of the third filtering capacitor are connected together, and further connected to an output end of the voltage follower;
a non-inverting input end of the voltage follower is respectively connected to a first end of a fifth filtering resistor and a first end of a fourth filtering resistor, a second end of the fifth filtering resistor is grounded, and a second end of the fourth filtering resistor is connected to the output end of the amplifier; and
a bandwidth BW and a Q value are, respectively:

$BW = f_H - f_L = 4(1-m)f_0;$ $$Q = \frac{f_0}{f_H - f_L} = \frac{1}{4(1-m)};$$

wherein, BW is the bandwidth, $f_H$ is an upper cutoff frequency, $f_L$ is a lower cutoff frequency, $f_0$ is a center frequency, Q is a ratio of the center frequency to the bandwidth, and m is a positive feedback coefficient;
the value of m is close to 1;
when the center frequency is set to 50 Hz, the bandwidth is reduced by increasing the Q value; and
the fourth filtering resistor and the fifth filtering resistor are configured to determine the value of the positive feedback coefficient m.

3. The receiver according to claim 1, wherein
the input-stage amplification circuit comprises: a first transistor, a second transistor, a third transistor, a fourth transistor, a fifth transistor, a sixth transistor, a seventh transistor, an eighth transistor, and a ninth transistor; and
a first resistor, a second resistor, a third resistor, a fourth resistor, a fifth resistor, and a sixth resistor;

wherein the first transistor and the second transistor form a current mirror;
the emitters of the first transistor and the second transistor are connected to a power supply, respectively;
the base of the first transistor is connected to the base of the second transistor, the collector of the third transistor, and the collector of the fourth transistor;
the collector of the first transistor is connected to the collector of the fourth transistor;
the base of the third transistor is connected to a first end of the first resistor, and a second end of the first resistor is grounded;
the base of the fourth transistor is connected to a first end of the second resistor, and a second end of the second resistor is grounded;
the emitter of the third transistor is connected to the emitter of the fifth transistor;
the emitter of the fourth transistor is connected to the emitter of the sixth transistor;
the base of the fifth transistor is connected to the base of the sixth transistor;
the collector of the fifth transistor is respectively connected to the collector of the seventh transistor and the base of the ninth transistor;
the collector of the sixth transistor is respectively connected to the collector of the eighth transistor and to the base of a twelfth transistor in the middle-stage amplification circuit;
the base of the seventh transistor is connected to the base of the eighth transistor;
the emitter of the seventh transistor is respectively connected to a first end of the fourth resistor and a first end of the third resistor;
the emitter of the eighth transistor is respectively connected to a first end of the fifth resistor and a second end of the third resistor; and
a second end of the fourth resistor and a second end of the fifth resistor are connected to a negative voltage.

4. The receiver according to claim 1, wherein
the middle-stage amplification circuit comprises: a seventh resistor, an eighth resistor, a ninth resistor, a tenth resistor, a zeroth resistor, a tenth transistor, an eleventh transistor, and a twelfth transistor;
a first end of the seventh resistor and a first end of the eighth resistor are connected to a positive voltage, respectively;
a second end of the seventh resistor is respectively connected to the base of the tenth transistor, the base of the eleventh transistor, and the collector of the eleventh transistor;
the emitters of the tenth transistor and the eleventh transistor are connected to a negative voltage; and
a second end of the eighth resistor is connected to a first end of the ninth resistor, a second end of the ninth resistor is respectively connected to a second end of the zeroth resistor and the collector of the twelfth transistor, an emitter of the twelfth transistor is connected to a first end of the tenth resistor, and a second end of the tenth resistor is connected to a negative voltage.

5. The receiver according to claim 1, wherein the output-stage amplification circuit comprises: the thirteenth resistor, an eleventh resistor, a twelfth resistor, a fourteenth resistor, a first capacitor, a second capacitor, and an nth capacitor;
wherein a first end of the thirteenth resistor is connected to a positive voltage;

a second end of the thirteenth resistor is respectively connected to a first end of the second capacitor and a first terminal of an operational amplifier;

a second end of the second capacitor is respectively connected to ground and a first end of the eleventh resistor, a second end of the eleventh resistor is respectively connected to a non-inverting input terminal of the operational amplifier and a first end of the first capacitor;

a second end of the first capacitor is respectively connected to a first end of the zeroth resistor and to a second end of the ninth resistor in the middle-stage amplification circuit;

a first end of the twelfth resistor is connected to an inverting input terminal of the operational amplifier, and a second end thereof is respectively connected to ground and to a first end of the third capacitor;

a second end of the third capacitor is respectively connected to a second terminal of the operational amplifier and a first end of the fourteenth resistor; and a second end of the fourteenth resistor is connected to a negative voltage.

6. The receiver according to claim 1, wherein the first power supply filtering circuit comprises a thirteenth transistor, an emitter of the thirteenth transistor is connected to an anode of an eighth diode, an anode of a ninth diode, and a first end of a first filtering capacitor;

a second end of the first filtering capacitor is connected to ground;

a collector of the thirteenth transistor is respectively connected to a cathode of a seventh diode, a first end of a second filtering capacitor, a first end of a seventeenth resistor, and an input power supply;

a second end of the seventeenth resistor, an anode of the seventh diode, a second end of an eighteenth resistor, a first end of an nth filtering capacitor, and a first end of a fourth filtering capacitor are connected together;

a second end of the nth filtering capacitor and a second end of the fourth filtering capacitor are connected together and to ground; and a base of the thirteenth transistor is connected to a cathode of the eighth diode and to a first end of the eighteenth resistor.

7. The receiver according to claim 1, wherein the second power supply filtering circuit comprises a fourteenth transistor, an emitter of the fourteenth transistor is connected to a cathode of an eleventh diode, a first end of a fifth filtering capacitor, and a cathode of a twelfth diode;

a second end of the fifth filtering capacitor is connected to ground;

a base of the fourteenth transistor is respectively connected to a first end of a twentieth resistor and an anode of the eleventh diode;

a collector of the fourteenth transistor is respectively connected to a first end of a nineteenth resistor, an anode of a twelfth transistor, an anode of the twelfth diode, and a first end of a sixth filtering capacitor;

a second end of the sixth filtering capacitor is connected to ground;

a cathode of the twelfth transistor is respectively connected to a second end of the twentieth resistor, a second end of the nineteenth resistor, a first end of a seventh filtering capacitor, and a first end of an eighth filtering capacitor; and a second end of the seventh filtering capacitor and a second end of the eighth filtering capacitor are connected together and to ground.

8. The receiver according to claim 1, wherein the active filtering circuit comprises:

a first active filter operational amplifier and a second active filter operational amplifier;

wherein an output terminal of the first active filter operational amplifier is connected to a first end of a first active filter resistor, a first end of a first active filter capacitor, and an inverting input terminal of the first active filter operational amplifier;

a second end of the first active filter capacitor is respectively connected to the first end of the first active filter resistor and a first end of a second active filter resistor;

a second end of the second active filter resistor is respectively connected to a first end of a second active filter capacitor and a non-inverting input terminal of the first active filter operational amplifier;

an output terminal of the second active filter operational amplifier is respectively connected to a first end of an third active filter capacitor and an inverting input terminal of the second active filter operational amplifier;

a second end of the third active filter capacitor is respectively connected to a first end of an third active filter resistor and to a first end of a fourth active filter resistor; and a second end of the fourth active filter resistor is respectively connected to a first end of a fourth active filter capacitor and to a non-inverting input terminal of the second active filter operational amplifier.

9. The receiver according to claim 1, wherein the main control board is provided with a cascaded digital filtering and sampling device, the cascaded digital filtering and sampling device comprising:

a first FIR filtering down-sampling device, an input end of the first FIR filtering down-sampling device being configured to receive original data, and an output end thereof outputting first down-sampled data having a frequency that is one-half of the frequency of the original data;

a second FIR filtering down-sampling device, an input end of the second FIR filtering down-sampling device being configured to receive the first down-sampled data, and an output end thereof outputting second down-sampled data having a frequency that is one-half of the frequency of the first down-sampled data;

an third FIR filtering down-sampling device, an input end of the third FIR filtering down-sampling device being configured to receive the second down-sampled data, and an output end thereof outputting third down-sampled data having a frequency that is one-half of the frequency of the second down-sampled data;

a fourth FIR filtering down-sampling device, an input end of the fourth FIR filtering down-sampling device being configured to receive the third down-sampled data, and an output end thereof outputting fourth down-sampled data having a frequency that is one-half of the frequency of the third down-sampled data; and a data selector, an input end of the data selector being configured to receive the original data, the first down-sampled data, the second down-sampled data, the third down-sampled data, and the fourth down-sampled data, and an output end of the data selector, configured to output the final filtered data.

* * * * *